United States Patent [19]

Berman et al.

[11] Patent Number: 4,756,954

[45] Date of Patent: Jul. 12, 1988

[54] EPOXY RESIN LAMINATING VARNISH AND LAMINATES PREPARED THEREFROM

[75] Inventors: Jody R. Berman; Avis L. McCrary, both of Lake Jackson; Dennis L. Steele, Freeport, all of Tex.

[73] Assignee: The Dow Chemical Company, Midland, Mich.

[21] Appl. No.: 45,972

[22] Filed: May 1, 1987

Related U.S. Application Data

[63] Continuation-in-part of Ser. No. 821,362, Jan. 22, 1986, abandoned.

[51] Int. Cl.$^4$ ............................................. C08L 63/02
[52] U.S. Cl. ...................................... 428/273; 427/96; 428/290; 428/418; 428/209; 428/901; 523/466; 525/527
[58] Field of Search ................ 525/527; 428/273, 209, 428/290, 418, 901; 523/466

[56] References Cited

U.S. PATENT DOCUMENTS

| | | | |
|---|---|---|---|
| 3,016,362 | 1/1962 | Wismer | 525/527 |
| 3,321,549 | 5/1967 | Barth | 260/830 |
| 3,406,020 | 10/1968 | D'Alessandro | 51/298 |
| 3,424,707 | 1/1969 | Schaufelberger | 260/32.8 |
| 3,477,990 | 11/1969 | Dante et al. | 528/102 |
| 3,647,726 | 3/1972 | Ulmer | 260/10 EP |
| 3,888,942 | 6/1975 | Tsen | 525/527 X |
| 4,075,260 | 2/1978 | Tsen et al. | 525/527 |
| 4,104,257 | 8/1978 | Clarke | 528/102 |
| 4,343,731 | 8/1982 | Pucci et al. | 523/427 |
| 4,501,787 | 2/1985 | Marchetti et al. | 428/236 |
| 4,559,392 | 12/1985 | Grundmann | 525/390 |

Primary Examiner—Earl Nielsen

[57] ABSTRACT

Compositions comprising (A) a halogenated phenoxy resin and (B) an advanced epoxy resin are useful in the preparation of electrical laminates when admixed with a suitable curing agent such as dicyandiamide.

39 Claims, No Drawings

EPOXY RESIN LAMINATING VARNISH AND LAMINATES PREPARED THEREFROM

This application is a continuation-in-part of Ser. No. 821,362, filed Jan. 22, 1986, now abandoned.

BACKGROUND OF THE INVENTION

The present invention pertains to a mixture of a halogenated phenoxy resin and an advanced epoxy resin, laminating varnishes containing same and laminates prepared therefrom.

Electrical laminates are prepared by blending minor amounts of a phenoxy resin with an advanced epoxy resin, curing agent therefor and solvents if required. Shell Chemical Company in Bulletin SC:850-85 discloses the use of ultrahigh molecular weight epoxy resins as a modifier in adhesives and electrical laminates to impart flexibility and to modify the flow properties therein. The phenoxy resin provides flow control for the composition during the laminating stage which involves pressure molding of layers of substrates impregnated with the laminating varnish. This prevents the resin from flowing out of the press or mold which prevents resin poor areas in the resultant laminate. While the phenoxy resins employed provide for good flow control during molding or pressing of the impregnated substrates, the resultant laminates exhibit a decrease in one or more of their mechanical properties such as, for example, glass transition temperature, moisture and blister resistance and flame retardant properties.

The present invention provides a method for eliminating or decreasing the loss in one or more of the physical properties such as, for example, glass transition temperature, moisture and blister resistance and flame retardant properties by employing as the phenoxy resin a halogenated phenoxy resin.

SUMMARY OF THE INVENTION

The present invention pertains to a composition which comprises (A) from about 0.5 to about 50, preferably from about 1 to about 20, most preferably from about 3 to about 10 percent by weight of the combined weight of components (A) and (B) of at least one aromatic nuclearly halogenated phenoxy resin: and (B) from about 99.5 to about 50, preferably from about 99 to about 80, most preferably from about 97 to about 90 percent by weight of the combined weight of components (A) and (B) of at least one advanced epoxy resin.

Another aspect of the present invention pertains to a curable composition which comprises (A) at least one aromatic nuclearly halogenated phenoxy resin:

(B) at least one advanced epoxy resin;

(C) a curing quantity of at least one curing agent for said advanced epoxy resin; and (D) optionally one or more solvents; and wherein components (A) and (B) are present in an amount which provides from about 0.5 to about 50, preferably from about 1 to about 90, most preferably from about 3 to about 10 percent by weight of component (A) and from about 99.5 to about 50, preferably from about 99 to about 10, most preferably from about 97 to about 90 percent by weight of component (B) based upon the combined weight of components (A) and (B).

Another aspect of the present invention pertains to the product resulting from curing the aforementioned curable compositon.

Another aspect of the present invention pertains to a substrate impregnated with the aforementioned curable composition.

Still another aspect of the present invention pertains to a laminate prepared from one or more of the aforementioned impregnated substrates.

A further aspect of the present invention pertains to an electrical laminate comprising at least one electroconductive layer and one or more layers of the aforementioned impregnated substrates.

DETAILED DESCRIPTION OF THE INVENTION

Phenoxy resins are well known and are prepared by reacting a diglycidyl ether of a dihydric phenol with a dihydric phenol in the presence of a suitable catalyst in quantities which provide a phenolic hydroxyl to epoxy ratio of from about 0.9:1 to about 1.1:1, preferably from about 0.92:1 to about 0.99:1, most preferably from about 0.95:1 to about 0.98:1.

The advanced epoxy resins employed in the present invention can be prepared as above employing (a) an aromatic halogenated epoxy resin and a non-halogenated phenolic material, (b) a non-halogenated epoxy resin and an aromatic halogenated phenolic material, (c) an aromatic halogenated epoxy resin and an aromatic halogenated phenolic material or (d) a non-halogenated epoxy resin and a non-halogenated phenolic material.

Suitable phenolic materials which can be employed to prepare the aromatic halogenated phenoxy resins include, for example, those represented by the following Formulas I and II:

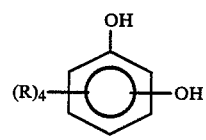

Formula I.

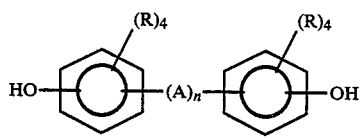

Formula II.

wherein A is a divalent hydrocarbyl group having from about 1 to about 20, preferably from about 2 to about 10, most preferably from about 3 to about 5 carbon atoms —S—, —S—S—, —SO—, —SO$_2$—, —O—, or —CO—; each R is independently hydrogen, a hydrocarbyl group having from about 1 to about 6, preferably from about 1 to about 4, most preferably from about 1 to about 2 carbon atoms or a halogen, preferably bromine: and n has a value of zero or 1. Particularly suitable phenolic hydroxyl-containing materials include, for example, tetrabromobisphenol A, resorcinol, bisphenol A, bisphenol S, mixtures thereof and the like.

Suitable epoxy resins which can be employed in the preparation of the aromatic halogenated phenoxy resins include, for example, those represented by the following Formulas III and IV:

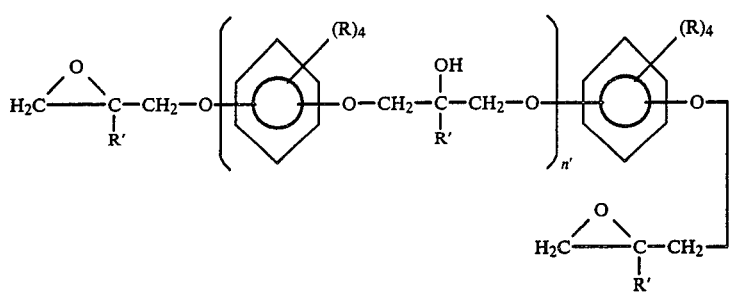

Formula III.

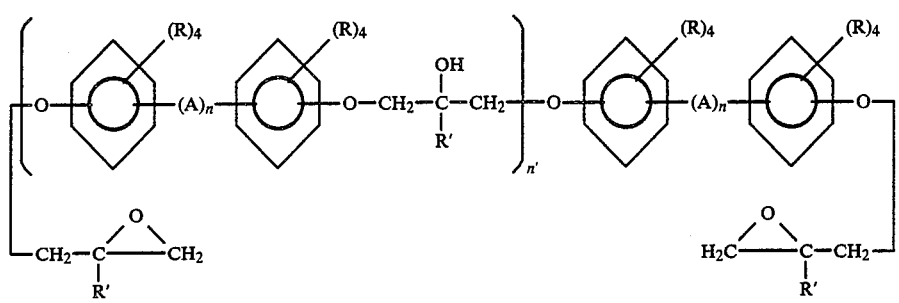

Formula IV.

wherein each A is independently a divalent hydrocarbyl group having from about 1 to about 20, preferably from about 2 to about 10, most preferably from about 3 to about 5 carbon atoms, —S—, —S—S—, —SO—, —SO$_2$—, —O— or —CO—; each R is independently hydrogen, a hydrocarbyl group having from about 1 to about 6, preferably from about 1 to about 4, most preferably from about 1 to about 2 carbon atoms or a halogen, preferably bromine; each R' is independently hydrogen or an alkyl group having from 1 to about 4 carbon atoms; n has a value of zero or 1 and n' has an average value from zero to about 10, preferably from about 0.1 to about 7, most preferably from about 0.1 to about 3. Particularly suitable epoxy resins include, for example, the diglycidyl ether of tetrabromobisphenol A, the diglycidyl ether of bisphenol A, the diglycidyl ether of bisphenol F, the diglycidyl ether of bisphenol S, the diglycidyl ether of resorcinol, the diglycidyl ether of biphenol, mixtures thereof and the like.

The phenoxy resin employed herein should contain a sufficient number of aromatic halogen atoms so as to provide the phenoxy resin with an aromatic halogen content of at least about 5, preferably from about 15 to about 50, most preferably from about 20 to about 40 percent by weight.

The phenolic halogenated phenoxy resins of the present invention can be represented by the following Formula V:

wherein A, R, R' and n are as defined above, each Z is independently a terminal group which is a —OH or $$-O-CH_2-\underset{R'}{C}\overset{O}{\overset{\diagup\diagdown}{-}}CH_2$$

group and n" has a value of at least 12, preferably from about 30 to about 100, most preferably from about 40 to about 70 with the proviso that at least a sufficient number of the R groups are a halogen to provide the aromatic halogenated phenoxy resin with the required halogen content.

The advanced epoxy resins which can be employed herein can be prepared by reacting a dihydric phenolic material with a material containing an average of more than one and preferably from about 2 to about 10, and most preferably from about 2 to about 4 vicinal epoxy groups per molecule in the presence of a suitable catalyst. In their preparation, the ratio of phenolic hydroxyl groups to epoxy groups is from about 0.05:1 to about 0.75:1, preferably from about 0.2:1 to about 0.6:1, most preferably from about 0.3:1 to about 0.4:1. These advanced epoxy resins can contain aromatic halogen atoms or they can be free of aromatic halogen atoms. For the preparation of electrical laminates, they preferably contain aromatic halogen atoms, preferably bromine atoms. Suitable advanced epoxy resins which can be employed in admixture with the halogenated phenoxy resins include, for example, those represented by

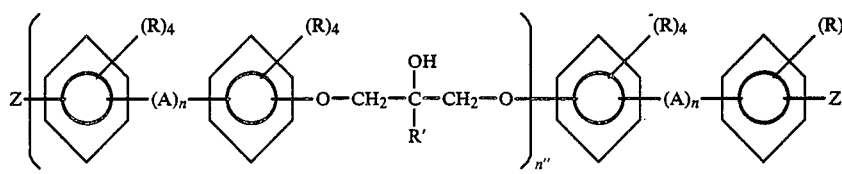

Formula V.

the Formulas III and IV wherein A, R, R' and n are as defined above and n' has a value from about 1 to about 10, preferably from about 2 to about 7, most preferably from about 3 to about 5. Particularly suitable advanced epoxy resins include, for example, the diglycidyl ether of bisphenol A advanced with tetrabromobisphenol A, the diglycidyl ether of bisphenol A advanced with bisphenol A, the diglycidyl ether of tetrabromobisphenol A advanced with tetrabromobisphenol A, mixtures thereof and the like. Each of these advanced epoxy resins have an average n' value as illustrated in Formula IV within the scope of the aforementioned range.

Suitable catalysts which can be employed to prepare the aromatic halogenated phenoxy resins and the advanced epoxy resins include, for example, quaternary ammonium compounds, phosphonium compounds, imidazoles, phosphines, tertiary amines, inorganic bases, mixtures thereof and the like. Particularly suitable catalysts include, for example, ethyltriphenylphosphonium acetate.acetic acid complex, ethyltriphenylphosphonium bromide, benzyl dimethyl amine, 2-methylimidazole, triphenyl phosphine, potassium hydroxide, mixtures thereof and the like.

Suitable solvents which can be employed herein include, for example, ketones, alcohols, glycol ethers, aromatic hydrocarbons, combinations thereof and the like. Particularly suitable solvents include, for example, methyl ethyl ketone, methyl isobutyl ketone, propylene glycol methyl ether, ethylene glycol methyl ether, methyl amyl ketone, methanol, isopropanol, toluene, xylene, dimethyl formamide, mixtures thereof and the like.

The solvents can be employed in the preparation of the aromatic halogenated phenoxy resins, in the preparation of the advanced epoxy resins and in the compositions of the present invention. They are present in any desirable quantity depending upon the particular application which is known by those skilled in the art.

Suitable curing agents which can be employed herein include, for example, biguanides, imidazoles, guanidines, aliphatic amines, aromatic amines, multifunctional phenols, thiols, sulfonamides, combinations thereof and the like. Particularly suitable curing agents include, for example, dicyandiamide, 2-methyl imidazole, tetramethylguanidine, cyanamide, 2-ethyl-4-methyl imidazole, ethylenediamine, methylene dianiline, diaminodiphenylsulfone, meta-phenylene diamine, phenolic novolac resins from phenol/formaldehyde condensation products, 1,2-benzenedithiol, sulfanilamide, mixtures thereof and the like. The specific amount of curing agent which is employed depends upon the particular epoxy resin being cured and the particular curing agent employed. Usually, amounts from about 0.5 to about 1.4, suitably from about 0.75 to about 1, more suitably from about 0.85 to about 1, most suitably from about 0.95 to about 1, times the theoretical stoichiometric amount required to cure the epoxy resin can be employed. The theoretical amount of curing agent required to cure an epoxy resin is deemed to be one equivalent of curing agent for each equivalent of epoxy groups.

Suitable substrates which can be employed herein include, for example, glass, graphite, aromatic polyamides, carbon, quartz, ceramic, synthetic and natural fibers, combinations thereof and the like in woven mat or fibrous form.

The compositions of the present invention may also contain, if desired, pigments, dyes, mold release agents, flow control agents, fillers, fire retardant agents, rubber modifiers, surfactants, accelerators, reactive diluents, combinations thereof and the like.

The compositions of the present invention are suitable for such applications as structural or electrical laminates or composites, coatings, adhesives, castings, moldings, electronic encapsulations and in potting compositions and the like.

The following examples are exemplary of the invention but are not to be construed as to limiting the scope thereof in any manner.

Epoxy Resin A was a diglycidyl ether of bisphenol A having an epoxide equivalent weight of 181.3.

Advanced Epoxy Resin A was the reaction product of a diglycidyl ether of bisphenol A having an epoxy equivalent weight of 188 and tetraorthobromobisphenol A having a phenolic hydroxyl equivalent weight of 272 and a bromine content of 58.7 percent by weight. The resultant advanced epoxy resin had an epoxy equivalent weight of 483 and a bromine content of 21 percent by weight.

Advanced Epoxy Resin B was the reaction product of a diglycidyl ether of bisphenol A having an epoxy equivalent weight of 188 and bisphenol A having a phenolic hydroxyl equivalent weight of 114. The resultant advanced epoxy resin had an epoxy equivalent weight of 421.

Brominated Phenoxy Resin A was prepared by charging into a 2-liter Parr reactor 235.8 g (1.3006 epoxy equiv.) of Epoxy Resin A and 349.5 g (1.2849 phenolic hydroxyl equiv.) of Halogenated Phenol A followed by the addition of 715 g of methyl ethyl ketone, 1.358 g (0.0023 equiv.) of Catalyst A and 1.010 g (0.0019 equiv.) of Catalyst B. The reactor was sealed and heated while stirring to 145° C. The pressure in the Parr reactor reached 68 psig (469 kPa). The temperature was controlled at 145° C. for 3 hours at which time the solution was cooled to room temperature. The resultant brominated phenoxy resin had an epoxide content of 0.12 percent and a solids content of 35% by weight.

Brominated Phenoxy Resin B was prepared by charging into a 30 gallon reactor 26.064 lbs. (65.268 equiv.) of Epoxy Resin A and 38.717 lbs. (64.623 equiv.) of halogenated phenol A followed by the addition of 106.274 lbs. of methyl ethyl ketone and 0.1103 lbs. (0.0854 equiv.) of catalyst A. The reactor was sealed and heated while stirring to 140° C. The pressure in the 30 gallon reactor reached 64 psig. (441 kPa). The temperature was controlled at 140° C. for 5 hours at which time the solution was cooled to room temperature ($\sim 25°$ C.). The resultant brominated phenoxy resin solution had an epoxide content of 0.022 percent and a solids content of 38.8% by weight.

Halogenated Phenol A was tetraorthobromobisphenol A having a bromine content of about 58.7 percent by weight and a phenolic hydroxyl equivalent weight of 272.

Catalyst A was ethyltriphenylphosphonium acetate. Acetic acid complex as a 70% by weight solution in methanol.

Catalyst B was tetrabutylphosphonium acetate.acetic acid complex as a 70% by weight solution in methanol.

EXAMPLE 1

Preparation of blend of Halogenated Phenoxy Resin and Advanced Eposy Resin 6.718 g ($1.8748 \times 10^{-4}$ equiv.) of Brominated Phenoxy Resin A was placed in an aluminum dish and heated in a vacuum oven at 175° C. at 5 mm Hg for 2 hours. The resultant solid brominated phenoxy resin, 0.611 (2.273×10$^{-4}$ equiv.) was blended with 6.176 g (0.0128 equiv.) of Advanced Epoxy Resin A by dissolving both in methylene dichloride and then placing on a 175° C. hot plate to drive off the methylene dichloride. The resultant blend had a melt viscosity of 1300 cp (1.3 Pa. s) at 150° C. The Advanced Epoxy Resin A had a melt viscosity of 500 cp (0.5 Pa.s) at 150° C.

EXAMPLE 2

A. Varnish Preparation (1) 2992 g (6.1927 equiv.) of Advanced Epoxy Resin A dissolved in 748 g of acetone.
(2) 450 g (0.0126 equiv.) of the brominated phenoxy solution prepared in Example 1.
(3) 89.8 g of dicyandiamide dissolved in 808 g of a 50/50 by weight blend of propylene glycol methyl ether/dimethylformamide.
(4) 2.99 g of 2-methylimidazole dissolved in 56.81 g of dimethylformamide.

The above four components were blended together along with an additional 1143 g of acetone. This formulation had a Zahn cup viscosity of 22 seconds and a gel time at 171° C. of 270 seconds.

B. Prepreg and Laminate Preparation

Burlington style 7628 glass cloth with an 1617 finish was impregnated with the varnish formulation of Example 1-C in a forced air vertical treater having a total length of 26 feet (7.9 meters) with the first 19.5 feet (5.9 meters) heated to 350° F. (176.67° C.) at a rate of 9 feet per minute (45.72 mm/sec.). The solid resin contained in the impregnated glass cloth had a 102 second gel time at 171° C. The resultant impregnated glass cloth had a resin content of 42.2% by weight.

Unclad laminates were made from the prepreg by pressing eight 12"×12" (3048 mm×3048 mm) plies at 500 psig (3447.4 kPa). The temperature in the press was initially 200° F. (93.3° C.) and was increased to 290° F. (143.3° C.) at 7° F./min. (0.0648° C./sec.). Then the temperature was raised to 350° F. (176.67° C.) at 20° F./min. (0.185° C./sec.) and held at 350° F. (176.67° C.) for 60 minutes. There was no post cure. The physical properties of the laminate are recorded in Table I.

COMPARATIVE EXPERIMENT A

A. Varnish Preparation (1) 3200 g (6.6233 equiv.) of Advanced Epoxy Resin A dissolved in 800 g of acetone.
(2) 168.3 g of PKHH (a phenoxy resin based upon bisphenol A and commercially available from Union Carbide Corp.) dissolved in 561 g of methyl ethyl ketone.
(3) 96 g of dicyandiamide dissolved in 864 g of a 50/50 blend of dimethylformamide/propylene glycol methyl ether.
(4) 3.2 g of 2-methylimidazole dissolved in 60.8 g of dimethylformamide.

The above components were blended together along with an additional 1293 g of acetone. This formulation had a Zahn cup viscosity of 21 seconds and a gel time at 171° C. of 247 seconds.

B. Prepreg and Laminate Preparation

The prepreg and laminate were prepared as in Example 2-B. The prepreg gel time was 85 seconds at 171° C. and the resin content on the glass was 42 percent by weight. The physical properties of the laminate are given in Table I.

COMPARATIVE EXPERIMENT B

A. Varnish Preparation (1) 3200 g (6.6233 equiv.) of Advanced Epoxy Resin A dissolved in 800 g of acetone.
(2) 96 g of dicyandiamide dissolved in 864 g of a 50/50 blend of dimethylformamide/propylene glycol methyl ether.
(3) 3.2 g of 2-methylimidazole dissolved in 60.8 g of dimethylformamide.

The above components were blended together along with an additional 1014 g of acetone. This formulation had a Zahn cup viscosity of 19 seconds and a gel time at 171° C. of 210 seconds.

B. Prepreg and Laminate Preparation

The prepreg and laminate were prepared as in Example 1-B. The prepreg gel time was 90 seconds at 171° C. and the resin content on the glass was 41.4 percent by weight. The physical properties of the laminate are given in Table I.

TABLE I

| PHYSICAL PROPERTIES OF LAMINATES | | | |
|---|---|---|---|
| Physical Property | Ex. 1 | Comp. Expt. A | Comp. Expt. B |
| Laminate thickness, in. | 48 | 48 | 48 |
| Laminate thickness, mm | 1219.2 | 1219.2 | 1219.2 |
| Tg (DSC)[1], °C. | 126 | 123 | 125 |
| Tg (DMA)[2], °C. | | | |
| Initial | 130 | 130 | 125 |
| After 60 min. exposure to 15 psig, steam, °C. | 120 | 112 | 95 |
| Blister Resistance[3] sides passed/total sides | 5.5/6 | 0/6 | 1/6 |

[1]DSC is Differential Scanning Calorimetry.
[2]DMA is Dynamic Mechanical Analysis.
[3]Laminates were immersed in 500° F. molten solder for 20 seconds.

EXAMPLE 3

A. Varnish Preparation (1) 3200 g (7.595 equiv.) of Advanced Epoxy Resin B dissolved in 800 g of acetone.
(2) 460.3 g (0.0024 equiv.) of Brominated Phenoxy Resin B.
(3) 96 g of dicyandiamide dissolved in 864 g of a 50/50 by weight blend of propylene glycol methyl ether/dimethylformamide.
(4) 3.2 g of 2-methylimidazole dissolved in 127.8 g of dimethylformamide.

The above four components were blended together along with an additional 1477.1 g of acetone. This formulation had a Zahn cup viscosity of 22.5 seconds and a gel time at 171° C. of 239 seconds.

B. Prepreg and Laminate Preparation

Burlington style 7628 glass cloth with an I617 finish was impregnated with the varnish formulation of Example 3-A in a forced air vertical treater having a total length of 26 feet (7.9 meters) with the first 19.5 feet (5.9 meters) heated to 350° F. (176.67° C.) at a rate of 9 feet per minute (45.72 mm/sec.). The solid resin contained in the impregnated glass cloth had a 144 second gel time at 171° C. The resultant impregnated glass cloth had a resin content of 40.5% by weight.

Unclad laminates were made from the prepreg by pressing eight 12"×12" (3048 mm ×3048 mm) plies at a maximum pressure of 500 psig (3447.4 kPa). The temperature in the press was initially 350° F. (176.7° C.). The pressure was initially applied at 68.5 psig (572.3 kPa) and increased to 500 psig (3447.4 kPa) at 14 psig/min (96.5 kPa) the first 10 minutes and then rapidly to the final 500 psig (3447.4 kPa) pressure. The temperature was held at 350° F. (176.67° C.) for 60 minutes. There was no post cure. The physical properties of the laminate are recorded in Table II.

COMPARATIVE EXPERIMENT C

A. Varnish Preparation (1) 3200 g (7.595 equiv.) of Advanced Epoxy Resin B dissolved in 800 g of acetone.
(2) 160 g of PKHH (a phenoxy resin based upon bisphenol A and commercially available from Union Carbide Corp.) dissolved in 373 g of methyl ethyl ketone.
(3) 96 g of dicyandiamide dissolved in 864 g of a 50/50 blend of dimethylformamide/propylene glycol methyl ether.
(4) 3.2 g of 2-methylimidazole dissolved in 60.8 g of dimethylformamide.

The above components were blended together along with an additional 1516.7 g of acetone. This formulation had a Zahn cup viscosity of 23 seconds and a gel time at 171° C. of 220 seconds.

B. Prepreg and Laminate Preparation

The prepreg and laminate were prepared as in Example 3-B employing the above varnish formulation. The prepreg gel time was 77 seconds at 171° C. and the resin content on the glass was 40.5 percent by weight. The physical properties of the laminate are given in Table II.

COMPARATIVE EXPERIMENT D

A. Varnish Preparation (1) 3200 g (7.595 equiv.) of Advanced Epoxy Resin B dissolved in 800 g of acetone.
(2) 96 g of dicyandiamide dissolved in 864 g of a 50/50 blend of dimethylformamide/propylene glycol methyl ether.
(3) 3.2 g of 2-methylimidazole dissolved in 60.8 g of dimethylformamide.

The above components were blended together along with an additional 1236.3 g of acetone. This formulation had a Zahn cup viscosity of 23 seconds and a gel time at 171° C. of 209 seconds.

B. Prepreg and Laminate Preparation

The prepreg and laminate were prepared as in Example 3-B employing the above varnish formulation. The prepreg gel time was 90 seconds at 171° C. and the resin content on the glass was 41.4 percent by weight. The physical properties of the laminate are given in Table II.

TABLE II

| Physical Property | Ex. 3 | Comp. Expt. C | Comp. Expt. D |
|---|---|---|---|
| PHYSICAL PROPERTIES OF LAMINATES | | | |
| Laminate thickness, mils | 57 | 63 | 61 |
| Laminate thickness, mm | 1.4478 | 1.6002 | 1.5494 |
| Tg (DSC)[1], °C. | 115 | 115 | 113 |
| Tg (DMA)[2], °C. | | | |
| Initial | 112 | 113 | — |
| After 30 min. exposure to 15 psig, steam, °C. | 91 | 91 | — |
| Blister Resistance[3] sides passed/total sides | 3/6 | 0/6 | 0/6 |

[1]DSC is Differential Scanning Calorimetry.
[2]DMA is Dynamic Mechanical Analysis.
[3]Laminates were immersed in 470° F. molten solder for 20 seconds.

We claim:
1. The present invention pertains to a composition which comprises
   (A) from about 0.5 to about 50 percent by weight of the combined weight of components (A) and (B) of at least one aromatic nuclearly halogenated phenoxy resin having a halogen content of at least about 5 percent by weight; and
   (B) from about 99.5 to about 50 percent by weight of the combined weight of components (A) and (B) of at least one advanced epoxy resin.
2. A composition of claim 1 wherein
   (i) component (A) comprises from about 1 to about 20 percent by weight of the combined weight of components (A) and (B);
   (ii) component (B) comprises from about 99 to about 80 percent by weight of the combined weight of components (A) and (B); and
   (iii) component (A) has a halogen content of from about 15 to about 50 percent by weight.
3. A composition of claim 2 wherein
   (i) component (A) comprises from about 3 to about 10 percent by weight of the combined weight of components (A) and (B);
   (ii) component (B) comprises from about 97 to about 90 percent by weight of the combined weight of components (A) and (B); and
   (iii) component (A) has a halogen content of from about 20 to about 40 percent by weight.
4. A composition of claim 3 wherein
   (i) component (A) is represented by the following Formula V:

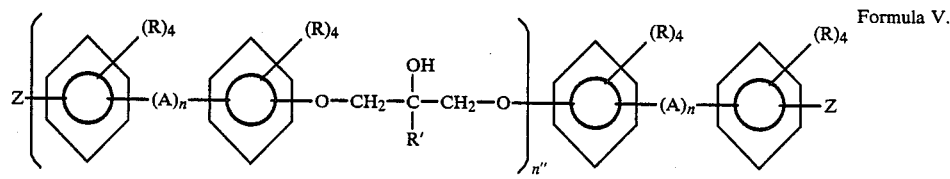

Formula V.

component (B) is represented by Formula IV:

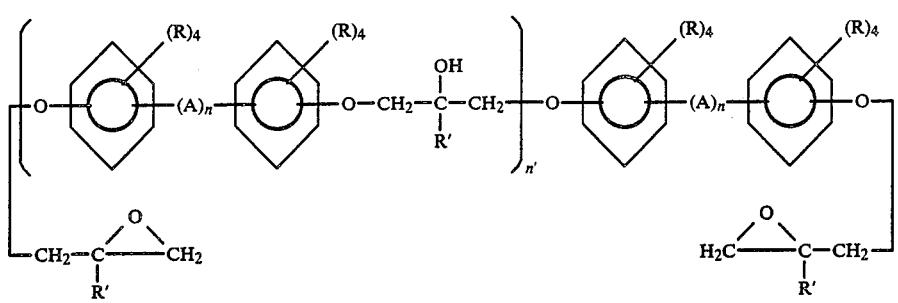

Formula IV.

and (iii) wherein each A is independently a divalent hydrocarbyl group having from about 1 to about 20 carbon atoms, —S—, —S—S—, —SO—, —SO₂—, —O— or —CO—; each R is independently hydrogen, a hydrocarbyl group having from about 1 to about 4 carbon atoms or a halogen; each R' is independently hydrogen or an alkyl group having from 1 to about 4 carbon atoms; each Z is independently a terminal —OH or

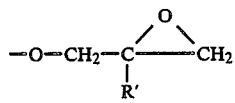

group; n has a value of zero or 1; n' has a value from about zero to about 10 and n" has a value of at least about 12; and with the proviso that at least a sufficient number of the R groups in Formula V are a halogen so as to provide the aromatic halogenated phenoxy resin with the required halogen content.

5. A composition of claim 4 wherein each A is independently a divalent hydrocarbyl group having from 1 to about 4 carbon atoms; each R is independently hydrogen, methyl or bromine; each R' is hydrogen; n has a value of 1; n' has a value of from about 0.1 to about 7; and n" has a value of from about 12 to about 150.

6. A curable composition which comprises
(A) at least one aromatic nuclearly halogenated phenoxy resin having a halogen content of at least about 5 percent by weight;

(B) at least one advanced epoxy resin;
(C) a curing quantity of at least one curing agent for said advanced epoxy resin; and
(D) optionally one or more solvents; and
wherein components (A) and (B) are present in an amount which provides from about 0.5 to about 50 percent by weight of component (A) and from about 99.5 to about 50 percent by weight of component (B) based upon the combined weight of components (A) and (B).

7. A curable composition of claim 6 wherein
(i) component (A) comprises from about 1 to about 20 percent by weight of the combined weight of components (A) and (B);
(ii) component (B) comprises from about 99 to about 80 percent by weight of the combined weight of components (A) and (B); and
(iii) component (A) has a halogen content of from about 15 to about 50 percent by weight.

8. A curable composition of claim 7 wherein
(i) component (A) comprises from about 3 to about 10 percent by weight of the combined weight of components (A) and (B);
(ii) component (B) comprises from about 97 to about 90 percent by weight of the combined weight of components (A) and (B); and
(iii) component (A) has a halogen content of from about 20 to about 40 percent by weight.

9. A curable composition of claim 8 wherein
(i) component (A) is represented by the following formula V:

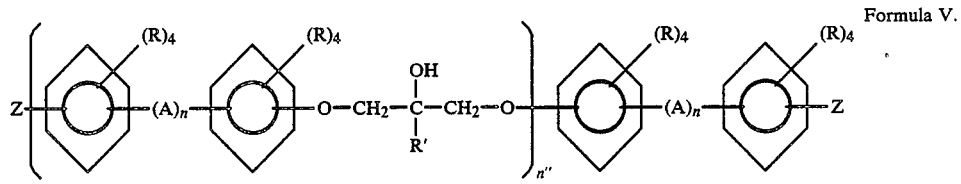

Formula V.

(ii) component (B) is represented by the following Formula IV:

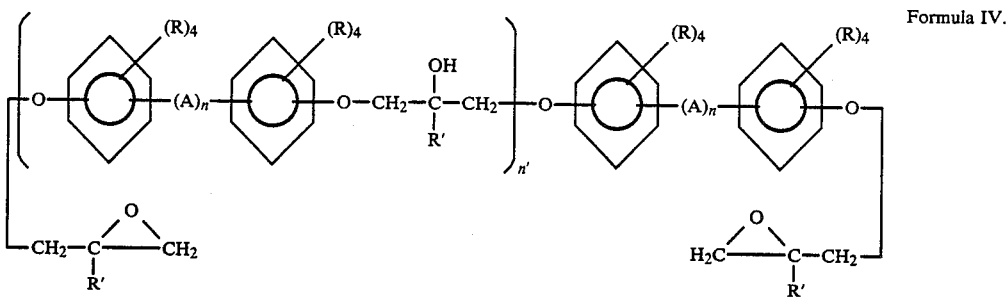

Formula IV.

(iii) component (C) is selected from guanidines, biguanides, aromatic amines, sulfonic acid amides, multi-functional phenols and combinations thereof;
(iv) component (D), when present, is selected from ketones, alcohols, glycol ethers, formamides and combinations thereof; and
(v) wherein each A is independently a divalent hydrocarbyl group having from about 1 to about 20 carbon atoms, —S—, —S—S—, —SO—, —SO$_2$—, —O— or —CO—; each R is independently hydrogen, a hydrocarbyl group having from about 1 to about 4 carbon atoms or a halogen; each R' is independently hydrogen or an alkyl group having from 1 to about 4 carbon atoms; each Z is independently a terminal —OH or

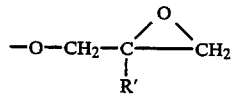

group; n has a value of zero or 1; n' has a value from about zero to about; 10 and n" has a value of at least about 12 and with the proviso that at least a sufficient number of the R groups in Formula V are a halogen so as to provide the aromatic halogenated phenoxy resin with the required halogen content.

10. A curable composition of claim 9 wherein each A is independently a divalent hydrocarbyl group having from 1 to about 4 carbon atoms; each R is independently hydrogen, methyl or bromine; each R' is hydrogen; n has a value of 1; ' has a value of from about 0.1 to about 7; and n" has a value of from about to about 150.

11. A substrate impregnated with a curable composition of claim 6.

12. A substrate impregnated with a curable composition of claim 7.

13. A substrate impregnated with a curable composition of claim 8.

14. A substrate impregnated with a curable composition of claim 9.

15. A substrate impregnated with a curable composition of claim 10.

16. An impregnated substrate of claim 15 wherein said substrate is glass or graphite in woven, mat or fibrous form.

17. A laminate prepared from one or more layers of the impregnated substrate of claim 11.

18. A laminate prepared from one or more layers of the impregnated substrate of claim 12.

19. A laminate prepared from one or more layers of the impregnated substrate of claim 13.

20. A laminate prepared from one or more layers of the impregnated substrate of claim 14.

21. A laminate prepared from one or more layers of the impregnated substrate of claim 15.

22. A laminate prepared from one or more layers of the impregnated substrate of claim 16.

23. A laminate of claim 17 which additionally contains one or more layers of an electroconductive material.

24. A laminate of claim 23 wherein said electroconductive material is copper.

25. A laminate of claim 18 which additionally contains one or more layers of an electroconductive material.

26. A laminate of claim 25 wherein said electroconductive material is copper.

27. A laminate of claim 19 which additionally contains one or more layers of an electroconductive material.

28. A laminate of claim 27 wherein said electroconductive material is copper.

29. A laminate of claim 20 which additionally contains one or more layers of an electroconductive material.

30. A laminate of claim 29 wherein said electroconductive material is copper.

31. A laminate of claim 21 which additionally contains one or more layers of an electroconductive material.

32. A laminate of claim 31 wherein said electroconductive material is copper.

33. A laminate of claim 22 which additionally contains one or more layers of an electroconductive material.

34. A laminate of claim 33 wherein said electroconductive material is copper.

35. The product resulting from curing a composition of claim 6 which is substantially free of solvent, component (D).

36. The product resulting from curing a composition of claim 7 which is substantially free of solvent, component (D).

37. The product resulting from curing a composition of claim 8 which is substantially free of solvent, component (D).

38. The product resulting from curing a composition of claim 9 which is substantially free of solvent, component (D).

39. The product resulting from curing a composition of claim 10 which is substantially free of solvent, component (D).

* * * * *

UNITED STATES PATENT AND TRADEMARK OFFICE
CERTIFICATE OF CORRECTION

PATENT NO.   : 4,756,954

DATED        : July 12, 1988

INVENTOR(S)  : Jody R. Berman, Avis L. McCrary, Dennis L. Steele

It is certified that error appears in the above-identified patent and that said Letters Patent is hereby corrected as shown below:

Col. 6, line 57; change "Acetic" to --acetic--.

Col. 10, line 68, Claim 4; insert --(ii)-- before "component (B)".

Col. 13, line 39, Claim 9; delete the semi-colon";" after 2nd occurrence of "about".

Col. 13, line 49, Claim 10; change " ' " to --n'--.

Col. 13, line 50, Claim 10; insert --12-- after 1st occurrence of "about".

Signed and Sealed this

Fourteenth Day of March, 1989

Attest:

DONALD J. QUIGG

*Attesting Officer*　　*Commissioner of Patents and Trademarks*